(12) United States Patent
Takahashi et al.

(10) Patent No.: US 7,592,132 B2
(45) Date of Patent: Sep. 22, 2009

(54) METHOD FOR FINE PATTERN FORMATION

(75) Inventors: Kiyohisa Takahashi, Kakegawa (JP); Yusuke Takano, Kakegawa (JP)

(73) Assignee: AZ Electronic Materials USA Corp., Somerville, NJ (US)

( * ) Notice: Subject to any disclaimer, the term of this patent is extended or adjusted under 35 U.S.C. 154(b) by 16 days.

(21) Appl. No.: 11/660,199

(22) PCT Filed: Aug. 31, 2005

(86) PCT No.: PCT/JP2005/015883

§ 371 (c)(1), (2), (4) Date: Feb. 13, 2007

(87) PCT Pub. No.: WO2006/025439

PCT Pub. Date: Mar. 9, 2006

(65) Prior Publication Data

US 2007/0248770 A1  Oct. 25, 2007

(30) Foreign Application Priority Data

Aug. 31, 2004 (JP) .......................... 2004-252123
Aug. 2, 2005 (JP) .......................... 2005-224050

(51) Int. Cl.
G03F 7/00 (2006.01)
G03F 7/004 (2006.01)

(52) U.S. Cl. ................. 430/331; 430/270.1; 430/273.1; 430/311; 430/330

(58) Field of Classification Search ................. 430/311, 430/273.1, 270.1, 330
See application file for complete search history.

(56) References Cited

U.S. PATENT DOCUMENTS 6,291,130 B1 * 9/2001 Kodama et al. .......... 430/270.1
6,319,853 B1 * 11/2001 Ishibashi et al. ............ 438/780
6,555,607 B1 4/2003 Kanda et al.
7,141,177 B2 11/2006 Tanaka
7,189,783 B2 * 3/2007 Kozawa et al. ................. 525/61

(Continued)

FOREIGN PATENT DOCUMENTS

| EP | 1 223 470 A1 | 7/2002 |
| JP | 5-241348 A | 9/1993 |
| JP | 6-250379 A | 9/1994 |

(Continued)

OTHER PUBLICATIONS

English Language Abstract of JP 5-241348 A, 1993.

(Continued)

*Primary Examiner*—Amanda C. Walke
(74) *Attorney, Agent, or Firm*—Sangya Jain

(57) ABSTRACT

In a method of effectively miniaturizing a resist pattern, a super fine pattern-forming method of restricting a film thickness of a crosslinked film and also preventing developing defects is provided using a super fine pattern-forming material which contains a solvent composed of a water-soluble resin, a water-soluble crosslinking agent, and water or a mixing solution of water and a water-soluble organic solvent, and an amine compound-containing developing solution. The amine compound-containing developing solution is preferably a primary amine compound such as polyallylamine, monomethanolamine, and monoethanolamine, a secondary amine compound such as dimethylamine, diethylamine, dimethanolamine, and diethanolamine, a tertiary amine compound such as trimethylamine, triethylamine, trimethanolamine, and triethanolamine, or a quarternary amine compound such as hydrated tetramethylamine.

11 Claims, 1 Drawing Sheet

U.S. PATENT DOCUMENTS

| | | |
|---|---|---|
| 2003/0008968 A1 | 1/2003 | Sugeta et al. |
| 2003/0091732 A1 | 5/2003 | Kanda |
| 2003/0157801 A1* | 8/2003 | Kozawa et al. ............ 438/689 |
| 2004/0096780 A1 | 5/2004 | Nozaki et al. |
| 2004/0121259 A1 | 6/2004 | Kozawa et al. |
| 2006/0088788 A1 | 4/2006 | Kudo et al. |
| 2006/0160015 A1 | 7/2006 | Takano et al. |
| 2006/0183218 A1 | 8/2006 | Takahashi et al. |
| 2006/0211814 A1 | 9/2006 | Nishikawa et al. |

FOREIGN PATENT DOCUMENTS

| | | |
|---|---|---|
| JP | 10-73927 A | 3/1998 |
| JP | 11-204399 A | 7/1999 |
| JP | 2001-19860 A | 1/2001 |
| JP | 2002-49161 A | 2/2002 |
| JP | 2002-60641 A | 2/2002 |
| JP | 2003-107752 A | 4/2003 |
| JP | 2003-316026 A | 11/2003 |
| JP | 2004-61668 A | 2/2004 |
| JP | 2004-77951 A | 3/2004 |

OTHER PUBLICATIONS

English Language Abstract of JP 6-250379 A, 1994.
English Language Abstract of JP 10-73927 A, 1998.
English Language Abstract of JP 11-204399 A, 1999.
English Language Abstract of JP 2002-60641 A, 2002.
English Language Abstract of JP 2003-316026 A, 2003.

* cited by examiner

METHOD FOR FINE PATTERN FORMATION

BACKGROUND OF THE INVENTION

1. Field of the Invention

The present invention relates to a pattern-forming method capable of forming a further miniaturized pattern by reducing a separation size between resist patterns or a pattern opening size already formed in forming the resist patterns in a semiconductor process, as well as using a super fine pattern-forming material capable of forming a super fine pattern restricting a film thickness of a crosslinked film while preventing a developing defect, which are difficult to achieve at the same time, by using an amine compound-containing developing solution.

2. Background Art

In an extensive field including manufacture of a semiconductor element such as LSI, production of a liquid crystal display surface of an LCD panel, and manufacture of a circuit substrate of a thermal head or the like, a resist pattern is formed on the substrate for formation of a micro element or micro fabrication. In formation of the resist pattern, there is used a so-called photo lithography method of performing developing treatment after a photosensitivity resin composition is exposed by selective illumination of active rays such as ultraviolet rays, far ultraviolet rays, excimer lasers, X-rays, and electron rays. In this photo lithography method, a positive type or negative type photosensitivity resin composition is used for forming the resist pattern.

Recently wiring and a separation width required in the manufacturing process have been increasingly miniaturized caused by high-integration of semiconductor devices or the like, and an exposure apparatus using a short-wavelength light source such as g-lines, i-lines, and excimer lasers corresponding to this trend is used, and a phase shift mask or the like is used at the time of the exposure in some exposure apparatuses. It is, however, difficult to form a miniaturization resist pattern exceeding the wavelength limit in the photo lithography by the conventional exposure, and also an exposure apparatus for the short-wavelength or an apparatus using the phase shift mask or the like is expensive. Therefore, there has been studied a method of effectively miniaturizing a resist pattern, which is formed using the conventional, known pattern-forming apparatus and the conventional, known positive type or negative type photosensitivity resin composition without use of such expensive apparatus.

One method of effectively miniaturizing a resist pattern is proposed. In the method, after a pattern formation is made by the conventional method in use of a known photosensitivity resin composition, for example, a chemical amplifying type photo resist, a coated layer made of a super fine pattern-forming material containing a water-soluble resin is formed on the formed resist pattern, and the resist is heated or exposed, thereby acid generated in the resist or acid contained in the resist is dispersed into the coated layer, the coated layer in the vicinity of the resist is crosslinked and cured by the dispersed acid, thereafter the first formed resist pattern is covered with the crosslinked film by removing the non-crosslinked coated layer to thicken the resist pattern, resultantly the width between the resist patterns, a separation size or a hole opening size of the resist is reduced to miniaturize the resist pattern, and the super fine resist pattern equal to or less than the resolution limit is effectively formed (refer to Japanese Unexamined Patent Publication No. 5-241348, No. 6-250379, No. 10-73927 and No. 11-204399).

Presently, in a case where after a super fine pattern-forming material is coated on the resist pattern to form a coated layer, which is heated and/or exposed, the resist pattern is developed to effectively form a super fine resist pattern equal to or less than the resolution limit, a developing solution composed of an exclusive developing solution (for example, refer to Japanese Unexamined Patent Publication No. 2002-49161) or a mixing solution of water and a water-soluble organic solvent is used for removing the non-crosslinked coated layer. Since the resist pattern is smaller in size than the conventional one caused by the progress of the lithography technology, in a case where the pattern size is further miniaturized by using the super fine pattern-forming material, there is an increasing demand for restricting the film thickness of the crosslinked film. In order to meet such demand, in an exclusive developing solution composed of water and water-soluble organic solvent and in purified water developing, an amount of a water-soluble crosslinking agent in the super fine pattern-forming material is reduced, or a temperature in performing a crosslinking reaction is lowered for restricting the film thickness of the crosslinked film. However, when the film thickness of the crosslinked film is adapted to be restricted in such a method, the crosslinking density of the crosslinked film is reduced to possibly generate developing defects frequently. That is, according to the conventional method, it is difficult to prevent occurrence of the developing defects, as well as at the same time, restricting the film thickness of the crosslinked coated film.

SUMMARY OF THE INVENTION

Accordingly, an object of the present invention is to provide a super fine pattern-forming method which has solved the conventional problems, that is, has no problems in a practical use, providing no occurrence of developing defects, and at the same time, restricting a film thickness of a crosslinked film formed.

Another object of the present invention is to provide a super fine pattern-forming method capable of forming a resist pattern without problems in a practical use in a method where a super fine pattern-forming material is coated on a resist pattern to form a coated layer on the resist pattern, a crosslinked layer is formed in the vicinity of the resist pattern by dispersing acid generated due to heating the resist pattern into the coated layer, and then, a non-crosslinked coated layer is eliminated by developing the coated layer.

The inventors, as a result of the research and study, have found out that in a super fine pattern-forming material containing a solvent composed of a water-soluble resin, a water-soluble crosslinking agent, and a solvent selected from the group consisting water and mixing solution of water and a water-soluble organic solvent, a film thickness of a crosslinked film is restricted by developing the super fine pattern-forming material with amine compound-containing developing solution, and as a result, the super fine pattern formation without developing defects is made even in a case the thickness of the crosslinked film is thin, and the film thickness of the crosslinked film can be also controlled by controlling the concentration of amine compound in the developing solution, whereby the inventors have come up with the present invention.

Namely, a super fine pattern-forming method according to the present invention includes coating a super fine pattern-forming material composition on a resist pattern containing a substance which can supply acid by heating to form a coated layer, dispersing the acid from the resist pattern by the heating, generating a crosslinking reaction in a portion contacting the resist pattern of the coated layer to form a crosslinked film in the coated layer, and developing the coated layer by eliminating a non-crosslinked portion of the coated layer with a developing solution, wherein the super fine pattern-forming material composition contains a water-soluble resin, a water-soluble crosslinking agent, and a solvent selected from the group consisting of water and a mixing solution of water and a water-soluble organic solvent, and wherein elimination of the non-crosslinked portion of the coated layer is made with the developing solution containing an amine compound.

A super fine pattern according to the present invention is formed by the above-described method.

A super fine pattern-forming method using an amine compound-containing developing solution according to the present invention can restrict a film thickness of a crosslinked film without reduction in amounts of a water-soluble crosslinking agent contained in a super fine pattern-forming material and also without reduction in a heating temperature in crosslinking reaction, as well as provide a super fine pattern without developing defects due to the super fine pattern-forming material. A super fine pattern-forming method according to the present invention can form a resist pattern in size equal to or less than a limit developing resolution of an exposure wavelength with high accuracy, high throughput, and low costs in micro fabrication for manufacturing electric parts such as semiconductors or three-dimensional super fine structures.

DETAILED DESCRIPTION OF THE PREFERRED EMBODIMENTS

Figure 1:
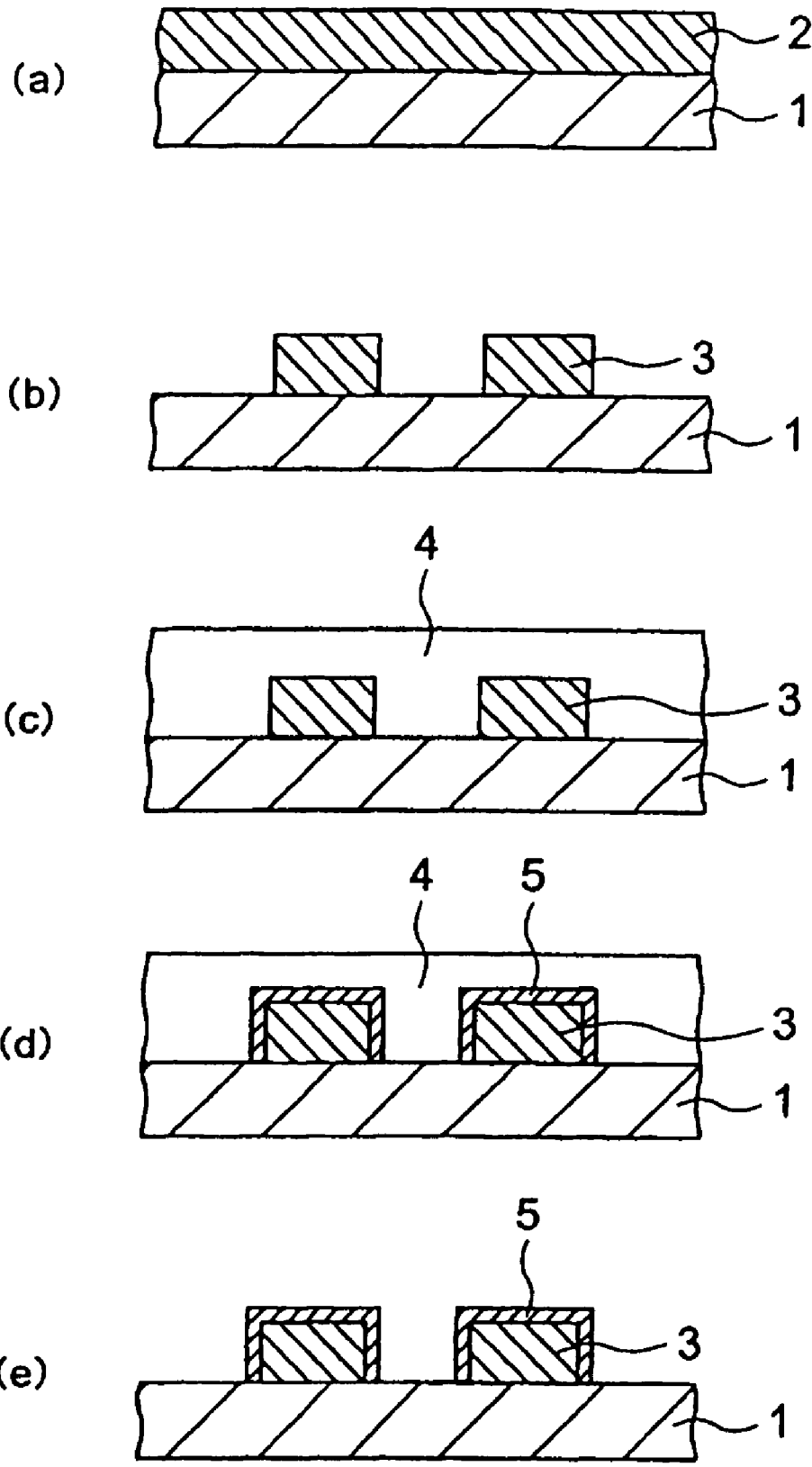
FIG. 1 is a process explanation view explaining a method of effectively performing miniaturization of a resist pattern by thickening a resist pattern and narrowing a size between the resist patterns with a super fine pattern-forming material.

The present invention will be explained in detail hereinafter.

The present invention improves the conventional, known super fine pattern-forming method to enable a super fine pattern formation in which a film thickness of a crosslinked film to be formed is restricted and developing defects are prevented.

A super fine pattern-forming method according to the present invention includes coating a super fine pattern-forming material composition on a resist pattern containing a substance which can supply acid by heating, producing and dispersing the acid from the resist pattern by the heating, generating a crosslinking reaction in a portion contacting the resist pattern of the coated layer to form a crosslinked film in the coated layer, and eliminating a non-crosslinked portion of the coated layer with a developing solution.

Elimination of the non crosslinked portion of the coated layer is called a second development to be distinguished from a development in forming the photo resist. The conventional, known super fine pattern-forming technology is disclosed, for example, in Japanese Unexamined Patent Publication No. 10-73927.

A super fine pattern-forming method according to the present invention will be explained as follows.

In a super fine pattern-forming method according to the present invention, a resist pattern can use a conventional resist pattern. Accordingly, a photo resist composition used for forming a resist pattern and a method of forming a resist using the photo resist composition may be either one of the conventional, known photo resist composition and the conventional, known resist-forming method. Note that it is required for the resist pattern to disperse or supply acid into a coated layer made of a super fine pattern-forming material by heating. A photo resist capable of forming such acid supply type resist pattern is preferably a chemical amplifying positive type photo resist. A coating method to a resist pattern by a super fine pattern-forming material may be any one of the conventional, known methods.

A semiconductor used in forming the resist pattern may be a bare semiconductor and also if necessary, may be a substrate such as a silicon having on the surface a silicon oxidizing film, a metal film such as aluminum, molybdenum or chrome, a metal oxidizing film such as ITO, or a silicon film such as poly silicon, or a substrate on which a circuit pattern or a semiconductor device is formed on the above substrate. With regard to a method of coating a photo resist composition, the conventional method such as a spin coating method, a roll coating method, a land coating method, a flow expanding coating method, or a dipping coating method may be used. With regard to an exposure light source, for example, far ultraviolet rays such as a KrF excimer laser, or an ArF excimer laser, X rays, or electric rays may be used. Further, a developing agent for the photo resist film may be any agent which can develop a chemical amplifying positive type photo resist used, and is typically an alkali water-soluble solution such as tetramethylammonium hydroxide, or sodium hydroxide. A method such as a paddle method or a spray method used for developing the conventional photo resist may be used as a developing method.

Next, a super fine pattern-forming material composition is coated on the resist pattern thus prepared. The super fine pattern-forming material composition of the present invention contains a water-soluble resin, a water-soluble crosslinking agent, and a solvent selected from the group consisting of water and a mixing solution of water and a water-soluble organic solvent. Herein the water-soluble resin and the water-soluble crosslinking agent is not particularly limited so far as those can form a crosslinked film by crosslinking reaction with acid dispersed from the resist pattern. In detail, polyvinyl alcohol and the derivative, and polyacryl acid and the derivative are used as a water-soluble resin, and a melamine derivative, a urea derivative, a guanamine derivative, glycoluryl, and an alkoxy alkyamine resin are used as a water-soluble crosslinking agent. These components are dissolved into a solvent to form a composition, but a solvent used in the present invention is a solvent composed of water or a mixing solution of water and a water-soluble organic solvent. It is generally preferable to use water, but a mixing solvent mixed with a water-soluble organic solvent because of an improvement of solubility of various components and of coating characteristics may be used. It is preferable that a water-soluble organic solvent which can be used in this case is a solvent which does not dissolve the resist pattern. It is preferable that the water-soluble organic solvent is a solvent which dissolves 0.1% in weight or more into water from a viewpoint of miscibility with the water. In detail, alcohol such as isopropyl alcohol, and ethyl alcohol, and amides such as N,N-dimethyl acetamide, are used as the solvent.

A mixing ratio of each component in the super fine pattern-forming material composition used in the present invention can be any ratio, but content of the water-soluble resin is generally 1 to 30 part by weight to water 100 part by weight or a mixing solvent 100 part by weight of water and a water-soluble organic solvent, preferably 2 to 15 part by weight, and content of the water-soluble crosslinking agent is generally 0.2 to 5 part by weight, preferably 0.5 to 2 part by weight.

A super fine pattern-forming material composition of the present invention can contain an amine compound if necessary. As such an amine compound, for example a polyallylamine derivative such as methoxycarbonyl polyallylamine and ethoxycarbobyl polyallylamine or a glucosamine derivative are exemplified. In a case where the super fine pattern-forming material composition contains the amine compound, it is assumed that this amine compound includes a function to promote dissolution of the non-crosslinked coated layer in developing the coated layer. In the super fine pattern-forming material composition according to the present invention, developing defects are not easily generated, but in a case where the super fine pattern-forming material composition contains the amine compound, the remarkable advantage of more effectively preventing generation of the developing defects is obtained.

In a method according to the present invention, in a case where the super fine pattern-forming material composition contains the amine compound, the content is preferably 0.1 to 5 part by weight per water or mixing solvent of water and water-soluble organic solvent 100 part by weight, more preferably 0.2 to 2 part by weight.

A super fine pattern-forming material composition according to the present invention can contain further a surface active agent. The surface active agent helps improve coating characteristics in coating the super fine pattern-forming material composition. As a surface active agent used in the super fine pattern-forming material composition, a nonionic surface active agent such as polyoxyethylene octylether, an anionic surface active agent such as alkyl benzene sulfonic acid, and a cationic surface active agent such as lauryl methyl ammonium chloride are exemplified. In a method according to the present invention, in a case where a super fine pattern-forming material composition contains a surface active agent, the content is preferably 0.01 to 0.1 part by weight per water or a mixing solvent of water and a water-soluble organic solvent 100 part by weight, more preferably 0.03 to 0.05 part by weight.

In a method according to the present invention, a coated layer is formed by coating a super fine pattern-forming material composition containing the above-described components on a resist pattern. This coating method may be any method, namely a conventional method, for example, a spin coating method, a roll coating method, a land coating method, a flow casting coating method, a dipping coating method, or the like. The thickness of the coated layer is not particularly limited so long as the coated layer is coated evenly on the resist pattern.

The resist pattern on which the super fine pattern-forming material composition is coated is heated after the solvent is eliminated by heating or the like if necessary. This heating causes the acid to be dispersed from the resist pattern into the coated layer, thereby crosslinking and curing the portions of the coated layer adjacent to the resist pattern. A heating time and a heating temperature are optionally selected depending on the kind of the resist pattern used, the kind of the super fine pattern-forming material composition, the thickness of the crosslinked film to be formed or the like, but sufficiently long heating time or sufficiently high heating temperature allows the developing defects to be effectively reduced. On the other hand, the heating time and the heating temperature should be properly selected to prevent formation of an excessive film thickness of the crosslinked film to be formed. From such a viewpoint, the heating time and the heating temperature are 30 to 100 sec, preferably 50 to 80 sec at 90 to 130° C., preferably 100 to 120° C.

The resist pattern on which the crosslinked film is formed by the heating is subsequently developed, thus eliminating the non-crosslinked coated layer (second developing).

In a super fine pattern-forming method according to the present invention, a developing solution used in the second developing process contains an amine compound. In the super fine pattern-forming method of the present invention, it is preferable that an amine compound which can be used in the developing process for eliminating the non-crosslinked coated layer is, for example a primary amine compound such as a polyallylamine, a monomethanolamine, or a monoethanolamine, a secondary amine such as a dimethylamine, a diethylamine, a dimethanolamine, or a diethanolamine, a tertiary amine compound such as a trimethylamine, a triethylamine, trimethanolamine, a triethanolamine, or a quarternary amine compound such as a hydrated tetramethylamine. The amine compound contained in the developing solution may be different from the amine compound contained in the super fine pattern-forming material composition.

The content of the amine compound contained in the second developing solution is appropriately adjusted in accordance with developing conditions of the second developing or the used super fine pattern-forming material composition. In general, when the content of the water-soluble crosslinking agent in the super fine pattern-forming material composition is small, the film thickness of the crosslinked film after the second developing is reduced, and on the other hand, when the content is large, the thickness is increased. In a case where the content of the water-soluble crosslinking agent in the super fine pattern-forming material composition is small, when the content of the amine compound in the second developing solution is excessively large, even the crosslinked film is possibly dissolved by the amine compound, resulting in the pattern formed in the photo resist being larger in size than the former. On the other hand, when the content of the amine compound in the second developing solution is small, the effect of the present invention, namely, reduction in the developing defects is not possibly achieved. In a case where the amine compound is contained in the super fine pattern-forming material composition, the effect of the present invention can be achieved with the smaller amount of the amine compound in the second developing solution. From this point of view, the concentration of the amine compound-containing developing solution is preferably 0.05% to 2.5%, more preferably 0.1% to 2.0% by weight of the entire developing solution as a standard.

It is preferable that the concentration of amine compound in the super fine pattern-forming material composition by weight per the solvent in the composition x (%) and the concentration of the amine compound in the second developing solution Y (%) meet the relation: $0.1 \leq x+y \leq 5$, more preferably $0.2 \leq x+y \leq 2.5$ in order to provide an appropriate film thickness and reduction in the developing defects of the crosslinked film to be used.

The solvent used in this developing solution is not particularly limited so long as the solvent eliminates the non-crosslinked coated layer, but preferably the solvent which does not dissolve the resist pattern. In detail, the water or the water-soluble organic solvent is exemplified as the solvent, and particularly the water is preferable.

In a method according to the present invention, the developing temperature and the developing time of the second development change depending on the film thickness of the crosslinked film to be formed, the kind of the super fine pattern-forming material composition, the kind of the second developing solution or the like. In general the developing defects are reduced more as the developing time is the longer, but considering the throughput, the developing condition is typically 15 to 100 sec at 15 to 30° C., preferably 45 to 90 sec at 20 to 25° C.

A method according to the present invention can use the conventional, known method except use of the super fine pattern-forming material and the amine compound-containing developing solution as the second developing solution.

One example of forming a resist pattern which can be used in a super fine pattern-forming method of the present invention will be explained hereinafter with reference to FIG. 1A and FIG. 1B. First, as shown in FIG. 1A, a chemical amplifying positive type radiation resin compound is coated on a work piece substrate 1 such as a semiconductor, a pre-bake (for example, a bake temperature: 70 to 150° C. for approximately one minute) is performed if necessary, to form a photo resist layer 2. Next, the photo resist layer 2 is exposed to light through a photo mask such as a reticle and thereafter, a post exposure bake (PEB) is performed if necessary (for example, bake temperature: 50 to 150° C.), and developed, and further, the bake after the developing is performed if necessary (for example, bake temperature: 60 to 120° C.) to form a positive type resist pattern 3 as shown in FIG. 1B.

Further, one exemplified method of the present invention in which a crosslinked film crosslinked on the resist pattern by acid is formed using the photo resist thus obtained, thereby narrowing a distance between the resist patterns and forming a pattern equal to or less than the limit resolution of the exposure wavelength will be explained with reference to FIG. 1C to FIG. 1E as follows. First, as shown in FIG. 1C, the super fine pattern-forming material compound of the present invention is coated on the resist pattern 3 formed by the chemical amplifying positive type photo resist, the coated super fine pattern-forming material compound is baked at a temperature of 65 to 85° C. for approximately one minute if necessary, to form a coated layer 4. Next, heating is performed, for example, at a temperature of 90 to 130° C. for approximately one minute in order to disperse the acid from the resist pattern 3 to the coated layer 4. Hereby, the acid is dispersed from the resist pattern 3, as shown in FIG. 1D, to form a crosslinked film 5 in the coated layer 4 adjacent the resist pattern 3. When the coated layer 4 is developed by the amine compound-containing developing solution (second developing) to eliminate the non-crosslinked coated layer, whereby, as shown in FIG. 1E, a pattern enlarged by the crosslinked film 5 is formed, resultantly the clearance between the resist patterns is narrowed and more miniaturized pattern is formed.

The pattern thus formed and miniaturized by a method of the present invention includes a pattern equal to or less than the limit resolution of the exposure wavelength and is used effectively for electric elements requiring a super fine pattern such as micro fabrication for an electric device of a semiconductor or manufacture of a three-dimensional super fine structure.

The following examples are shown for more detailed explanation of the present invention, but the present invention is not limited to these examples.

COMPARISON EXAMPLE 1

(Adjustment of Super Fine Pattern-Forming Material and Evaluation for Pattern Formation)

A polyvinyl acetal (acetyl value: 12 mol %. acetal value: 30 mol %) 100 part by weight, a water-soluble crosslinking agent 20 part by weight of a urea derivative (a methoxymethyl imidazolidinone), a methoxycarbonyl polyallylamine 4 part by weight (PAA-U50: product name) (made by Nitto Boseki Co., Ltd), and an acetylenol EL 0.5 part by weight (made by Kawaken Fine Chemicals Co., Ltd.) as a surface active agent were dissolved into a mixing solvent 1470 part by weight (an isopropyl alcohol 5 part by weight to purified water 95 part by weight) of purified water and an isopropyl alcohol as a water-soluble organic solvent to adjust the super fine pattern-forming material composition (Composition A). Next, as shown below, "inspection of film thickness of a crosslinked film" and "defect inspection after developing" were carried out.

(Inspection of Film Thickness in Crosslinked Film)

AZKrF-17B80 (made by Clariant Co., Ltd., registered trade mark "AZ", the same hereinafter) was spin-coated on a bare silicon wafer of 6 inches, and was baked by a direct hot plate at a temperature of 180° C. for 60 sec to form a reflection-preventive film having a thickness of 0.080 μm. Further, AZDX 5240P (made by made by Clariant Co., Ltd.) was spin-coated on the reflection-preventive film, which was then baked by a direct hot plate at a temperature of 90° C. for 60 sec to form a resist film having a thickness of 0.585 μm. This resist film was selectively exposed through a half tone mask by an excimer laser 248.4 nm KrF, and received a post exposure bake (PEB) by a direct hot plate at a temperature of 120° C. for 60 sec, and thereafter, paddle-developed for 60 sec by using AZ 300 MIF as a developing solution (made by Clariant Co., Ltd.: hydrated tetramethylammonium water-soluble solution 2.38% by weight). Hereby, a hole pattern of 0.220 μm in diameter was formed on the silicon wafer. Composition A was rotatingly coated on the hole pattern, which was then baked by a direct hot plate at a temperature of 85° C. for 70 sec to form a film of 0.350 μm. Next, in order to promote a crosslinking reaction at a boundary surface between the resist layer and Composition A, after heating (mixing bake) was performed by a direct hot plate at a temperature of 115° C. for 70 sec, a crosslinked film was formed by water flow-developing in purified water for 60 sec. A diameter of the hole pattern after the crosslinked film formation was measured by using CD-SEN (S9220 made by Hitachi High-Technologies Corporation), and the difference to an initial hole diameter was assumed as the film thickness. The obtained result is shown in Table 1.

(Defect Inspection after Developing)

AZKrF-17B80 (made by Clariant Co., Ltd.) was spin-coated on a bare silicon wafer of 8 inches, and was baked by a direct hot plate at a temperature of 180° C. for 60 sec to form a reflection-preventive film having a thickness of 0.080 μm. Further, AZDX 5240P (made by Clariant Co., Ltd.) was spin-coated on the reflection-preventive film, which was then baked by a direct hot plate at a temperature of 90° C. for 60 sec to form a resist film having a thickness of 0.585 μm. This resist film was selectively exposed through a binary mask by an excimer laser 248.4 nm KrF, and received a post exposure bake (PEB) by a direct hot plate at a temperature of 120° C. for 60 sec, and thereafter, paddle-developed for 60 sec by using AZ 300 MIF as a developing solution (made by Clariant Co., Ltd. hydrated tetramethylammonium water-soluble solution 2.38% by weight). Hereby, a hole pattern of 0.250 μm in diameter was formed on the silicon wafer. Composition A was rotatingly coated on the hole pattern, which was then baked by a direct hot plate at a temperature of 85° C. for 70 sec to form a film of 0.350 μm. Next, in order to promote a crosslinking reaction at a boundary surface between the resist layer and Composition A, after heating (mixing bake) was performed by a direct hot plate at a temperature of 115° C. for 70 sec, a crosslinked film was formed by water flow-developing in purified water for 60 sec.

A defect inspection measurement after developing was made using a surface defect inspector (KLA-2115 made by KLA-Tencor Co., Ltd.). In evaluation for the number of defects after the developing, when bridges or the like were formed in the hole pattern after the developing and the hole pattern was not clearly defined and developed, it was assumed as the defect after the developing, and the number of all the defects on the wafer was assumed as the defect number after the developing. The obtained result is shown in Table 1.

COMPARISON EXAMPLE 2

(Adjustment of a Super Fine Pattern-Forming Material Having a Reduced Amount of a Water-Soluble Crosslinking Agent, and Evaluation for The Pattern Formation)

A polyvinyl acetal (acetyl value: 12 mol %. acetal value: 30 mol %) 100 part by weight, a water-soluble crosslinking agent 10 part by weight of a urea derivative (a methoxymethyl imidazolidinone), a methoxycarbonyl polyallylamine 4 part by weight (made by Nitto Boseki Co., Ltd), and an acetylenol EL 0.5 part by weight (made by Kawaken Fine Chemicals Co., Ltd.) as a surface active agent were dissolved into a mixing solvent 1470 part by weight (an isopropyl alcohol 5 part by weight to purified water 95 part by weight) of purified water and an isopropyl alcohol as a water-soluble organic solvent to adjust the super fine pattern-forming material composition (Composition B). Next, "inspection of a film thickness of a crosslinked film" and "defect inspection after development" were carried out.

COMPARISON EXAMPLE 3

(Evaluation for Pattern Formation at a Reduced Crosslinking Reaction Temperature)

Composition A was used, and except that a temperature in the crosslinking reaction process was not 115° C., but 90° C., "inspection of the film thickness of the crosslinked film" and "defect inspection after development" were carried out the same as in Comparison example 1. The obtained result is shown in Table 1.

EXAMPLE 1

A polyvinyl acetal (acetyl value: 12 m o 1 %. acetal value: 30 mol %) 100 part by weight, a water-soluble crosslinking agent 20 part by weight of a urea derivative (a methoxymethyl imidazolidinone), and an acetylenol EL 0.5 part by weight (made by Kawaken Fine Chemicals Co., Ltd.) as a surface active agent were dissolved into a mixing solvent 1470 part by weight (an isopropyl alcohol 5 part by weight to purified water 95 part by weight) of purified water and an isopropyl alcohol as a water-soluble organic solvent to adjust the super fine pattern-forming material composition (Composition C). Except that Composition C was used, and a solvent used at the developing time was not the purified water, but water solution of 0.5% hydrated tetramethylammonium (TMAH) water solution, "inspection of the film thickness of the crosslinked film" and "defect inspection after development" were carried out the same as in Comparison example 1. The obtained result is shown in Table 1.

EXAMPLE 2

Composition A was used, and except that a solvent used at the developing time was not the purified water, but water solution of 0.05% hydrated tetramethylammonium (TMAH) water solution, "inspection of the film thickness of the crosslinked film" and "defect inspection after development" were carried out the same as in Comparison example 1. The obtained result is shown in Table 1.

EXAMPLE 3

Composition A was used, and except that a solvent used at the developing time was not the purified water, but water solution of 0.25% hydrated tetramethylammonium (TMAH) water solution, "inspection of the film thickness of the crosslinked film" and "defect inspection after development" were carried out the same as in Comparison example 1. The obtained result is shown in Table 1.

EXAMPLE 4

Composition A was used, and except that a solvent used at the developing time was not the purified water, but water solution of 0.5% hydrated tetramethylammonium (TMAH) water solution, "inspection of the film thickness of the crosslinked film" and "defect inspection after development" were carried out the same as in Comparison example 1. The obtained result is shown in Table 1.

EXAMPLE 5

Composition A was used, and except that a solvent used at the developing time was not the purified water, but water solution of 1.0% hydrated tetramethylammonium (TMAH) water solution, "inspection of the film thickness of the crosslinked film" and "defect inspection after development" were carried out the same as in Comparison example 1. The obtained result is shown in Table 1.

EXAMPLE 6

Composition A was used, and except that a solvent used at the developing time was not the purified water, but water solution of 1.5% hydrated tetramethylammonium (TMAH) water solution, "inspection of the film thickness of the crosslinked film" and "defect inspection after development" were carried out the same as in Comparison example 1. The obtained result is shown in Table 1.

EXAMPLE 7

Composition A was used, and except that a solvent used at the developing time was not the purified water, but water solution of 2.38% hydrated tetramethylammonium (TMAH) water solution, "inspection of the film thickness of the crosslinked film" and "defect inspection after development" were carried out the same as in Comparison example 1. The obtained result is shown in Table 1.

EXAMPLE 8

Composition A was used, and except that a solvent used at the developing time was not the purified water, but water solution of 0.5% polyallylamine water solution, "inspection of the film thickness of the crosslinked film" and "defect inspection after development" were carried out the same as in Comparison example 1. The obtained result is shown in Table 1.

EXAMPLE 9

Composition A was used, and except that a solvent used at the developing time was not the purified water, but water solution of 0.5% diethylamine water solution, "inspection of the film thickness of the crosslinked film" and "defect inspection after development" were carried out the same as in Comparison example 1. The obtained result is shown in Table 1.

TABLE 1

Inspection for film thickness of crosslinked film and Defect inspection after development

| Ex. No. | Composition | Temperature (° C.) at crosslinking reaction time | Developing solution | Developing time 16 sec | | Developing time 60 sec | |
|---|---|---|---|---|---|---|---|
| | | | | Film thickness of crosslinked film (nm) | Number of developing defects (number) | Film thickness of crosslinked film (nm) | Number of developing defects (number) |
| Comp. Ex. 1 | A | 115 | Purified water | 116 | 208 | 81 | 42 |
| Comp. Ex. 2 | B | 115 | Purified water | 86 | 240 | 58 | 118 |
| Comp. Ex. 3 | A | 90 | Purified water | 83 | 375 | 50 | 158 |
| Example 1 | C | 115 | 0.5% TMAH | 78 | 32 | 69 | 8 |
| Example 2 | A | 115 | 0.05% TMAH | 90 | 150 | 75 | 30 |
| Example 3 | A | 115 | 0.25% TMAH | 82 | 45 | 72 | 0 |
| Example 4 | A | 115 | 0.5% TMAH | 77 | 28 | 68 | 0 |
| Example 5 | A | 115 | 1.0% TMAH | 66 | 23 | 47 | 0 |
| Example 6 | A | 115 | 1.5% TMAH | 50 | 20 | 25 | 0 |
| Example 7 | A | 115 | 2.38% TMAH | 7 | 15 | 0 | 0 |
| Example 8 | A | 115 | 0.5% polyallylamine | 74 | 30 | 62 | 0 |
| Example 9 | A | 115 | 0.5% diethylamine | 77 | 29 | 64 | 0 |

From Table 1, it is found out that, in a case where a super fine pattern with a crosslinked film having a film thickness reduced by purified water developing is formed, the film thickness of the crosslinked film can be restricted by decreasing a temperature at crosslinking reaction, but it has the disadvantage that the number of the developing defects increases. In addition, by decreasing an amount of the water-soluble crosslinking agent contained in the super fine pattern-forming material, the super fine pattern having the thin film thickness of the crosslinked film can be formed without lowering a temperature at a crosslinking reaction time. However, even this method brings in the disadvantage that the number of developing defects increases.

On the other hand, from the result of the Example 1 according to the present invention, it is found out that, in a case where the amine compound is not contained in the super fine pattern-forming material, the number of developing defects is reduced as compared to the comparison examples. It is found out that in a case where, as shown in the Examples 2 to 7, the super fine pattern-forming material is developed using the amine compound-containing developing solution, the film thickness of the crosslinked film is controlled and restricted due to the concentration of the hydrated tetraethylammonium water solution, and at the same time, formation of the super fine pattern restricting generation of the developing defects is possible. From the results of the Examples 8 and 9, it is found out that the film thickness of the crosslinked film is controlled and also the super fine pattern without the developing defects can be formed using a polyallylamine water solution or a diethylamine water solution instead of the hydrated tetramethylammonium water solution.

The invention claimed is:

1. A super fine pattern-forming method, comprising the steps of:
    coating a super fine pattern-forming material composition on a resist pattern containing a substance which supplies acid by heating to form a coated layer;
    dispersing the acid from the resist pattern by the heating;
    generating a crosslinking reaction in a portion contacting the resist pattern of the coated layer to form a crosslinked film in the coated layer;
    eliminating a non-crosslinked portion of the coated layer with a developing solution; and
    thereby developing the coated layer, wherein:
    the super fine pattern-forming material composition contains a water-soluble resin, a water-soluble crosslinking agent, an amine compound selected from polyallylamine derivatives and glucosamine derivatives, and a solvent selected from the group consisting water and a mixing solution of water and a water-soluble organic solvent; and elimination of the non-crosslinked portion of the coated layer is made with a developing solution containing an amine compound wherein the concentration of amine compound in the super fine pattern-forming material composition by weight per the solvent in the composition x% and the concentration of the amine compound in the second developing solution Y% meet the relation $0.1 \leq x+y \leq 5$.

2. The super fine pattern-forming method according to claim 1, wherein:
    the super fine pattern-forming material composition further includes a surface active agent.

3. The super fine pattern-forming method according to claim 1, wherein:
    the developing solution includes at least one compound selected from groups consisting of a primary amine compound, a secondary amine compound, a tertiary compound, and a quaternary amine compound.

4. The super fine pattern-forming method according to claim 1, wherein:
    the concentration of an amine compound in the developing solution is in the range of 0.1 to 2.0%.

5. The super fine pattern-forming method according to claim 1, wherein:
    the developing step is performed at a temperature of 15 to 30° C.

6. A pattern formed in the super fine pattern-forming method according to claim 1.

7. A semiconductor element manufactured using the super fine pattern-forming method according to claim 1.

8. A liquid crystal display surface of an LCD panel manufactured using the super fine pattern-forming method according to claim 1.

9. The super fine pattern-forming method according to claim 1, where the amine compound in the developing solution is selected from polyallylamine, monomethanolamine, monoethanolamine, dimethylamine, diethylamine, dimethanolamine, diethanolamine, trimethylamine, triethylamine, trimethanolamine, triethanolamine, and hydrated tetramethyamine.

10. The super fine pattern-forming method according claim 1, wherein:
    the concentration of an amine compound in the developing solution is in the range of 0.05 to 2.5%.

11. The super fine pattern-forming method according to claim 2, wherein:
   the developing solution includes at least one compound selected from groups consisting of a primary amine compound, a secondary amine compound, a tertiary compound, and a quarternary amine compound.

* * * * *